US009596528B2

(12) United States Patent
Shim et al.

(10) Patent No.: US 9,596,528 B2
(45) Date of Patent: Mar. 14, 2017

(54) CAPACITIVE MICROMACHINED ULTRASONIC TRANSDUCER AND METHOD OF FABRICATING THE SAME

(71) Applicant: SAMSUNG ELECTRONICS CO., LTD., Suwon-si (KR)

(72) Inventors: Dong-sik Shim, Hwaseong-si (KR);
Seog-woo Hong, Yongin-si (KR);
Seok-whan Chung, Hwaseong-si (KR);
Chang-jung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 324 days.

(21) Appl. No.: 14/280,725

(22) Filed: May 19, 2014

(65) Prior Publication Data

US 2015/0156571 A1 Jun. 4, 2015

(30) Foreign Application Priority Data

Dec. 4, 2013 (KR) ........................ 10-2013-0150162

(51) Int. Cl.
*H04R 1/00* (2006.01)
*H01L 21/768* (2006.01)
(Continued)

(52) U.S. Cl.
CPC ............. *H04R 1/00* (2013.01); *B06B 1/0292* (2013.01); *H01L 21/0237* (2013.01);
(Continued)

(58) Field of Classification Search
CPC ..................................................... B06B 1/0292
See application file for complete search history.

(56) References Cited

U.S. PATENT DOCUMENTS 8,324,006 B1 12/2012 Adler et al.
2005/0177045 A1 8/2005 Degertekin et al.
(Continued)

FOREIGN PATENT DOCUMENTS

JP 4839176 B2 12/2011
KR 10-2013-0021200 A 3/2013

OTHER PUBLICATIONS

Communication dated Nov. 17, 2015, issued by the European Patent Office in counterpart European Application No. 14178360.5.
(Continued)

*Primary Examiner* — Luke Ratcliffe
*Assistant Examiner* — Hovhannes Baghdasaryan
(74) *Attorney, Agent, or Firm* — Sughrue Mion, PLLC

(57) ABSTRACT

A capacitive micromachined ultrasonic transducer includes a device substrate including a first trench confining a plurality of first parts corresponding to a plurality of elements and a second trench confining a second part separated from the plurality of first parts, a supporting unit provided on the device substrate for confining a plurality of cavities corresponding to each of the plurality of elements, a membrane provided on the supporting unit to cover the plurality of cavities, an upper electrode provided on the membrane and electrically connected to the second part in the second trench through a via hole passing through the membrane and the supporting unit, and a through-silicon via (TSV) substrate provided on a lower surface of the device substrate, and including a plurality of first via metals connected to the plurality of first parts and a second via metal connected to the second part.

10 Claims, 8 Drawing Sheets

(51) Int. Cl.
*H01L 21/304* (2006.01)
*H01L 23/48* (2006.01)
*H01L 21/02* (2006.01)
*B06B 1/02* (2006.01)

(52) U.S. Cl.
CPC ........ *H01L 21/3043* (2013.01); *H01L 21/768* (2013.01); *H01L 23/481* (2013.01); *H01L 2924/0002* (2013.01)

(56) References Cited

U.S. PATENT DOCUMENTS

| | | |
|---|---|---|
| 2009/0140609 A1 | 6/2009 | Huang |
| 2011/0115333 A1 | 5/2011 | Ezaki |
| 2012/0091543 A1* | 4/2012 | Torashima .......... B81C 1/00158 257/415 |

OTHER PUBLICATIONS

Xuefeng Zhuang et al.; "Integration of trench-isolated through-wafer interconnects with 2d capacitive micromachined ultrasonic transducer arrays", Sensors and Actuators A 138 (2007), pp. 221-229.

* cited by examiner

CAPACITIVE MICROMACHINED ULTRASONIC TRANSDUCER AND METHOD OF FABRICATING THE SAME

CROSS-REFERENCE TO RELATED APPLICATION

This application claims the benefit of Korean Patent Application No. 10-2013-0150162, filed on Dec. 4, 2013, in the Korean Intellectual Property Office, the disclosure of which is incorporated herein in its entirety by reference.

BACKGROUND

1. Field

Exemplary embodiments relate to a capacitive micromachined ultrasonic transducer and a method of manufacturing the same.

2. Description of the Related Art

A micromachined ultrasonic transducer (MUT) is used for transducing an electrical signal into an ultrasonic signal or transducing an ultrasonic signal into an electrical signal. The MUT may be classified into a piezoelectric micromachined ultrasonic transducer (PUMT), a capacitive micromachined ultrasonic transducer (CMUT), and a magnetic micromachined ultrasonic transducer (MMUT).

A conventional CMUT supplies electricity to an upper electrode by using a through via formed in a low resistance wafer. In a process of forming the through via, a corner of a through via hole is not completely coated with photoresist, and as a result, the through via may contact the low resistance wafer and be shorted. In addition, the photoresist with which the through via is filled may swell due to thermal expansion. In addition, a mask process for forming the through via is required.

SUMMARY

Exemplary embodiments provide a capacitive micromachined ultrasonic transducer for supplying current to an upper electrode through a low resistance wafer without a through via formed therein.

Exemplary embodiments further provide a method of manufacturing the capacitive micromachined ultrasonic transducer.

According to an aspect of an exemplary embodiment, there is provided a capacitive micromachined ultrasonic transducer including a device substrate including a first trench confining a plurality of first parts corresponding to a plurality of elements and a second trench confining a second part separated from the plurality of first parts, a supporting unit provided on the device substrate for confining a plurality of cavities corresponding to each of the plurality of elements, a membrane provided on the supporting unit to cover the plurality of cavities, an upper electrode provided on the membrane and electrically connected to the second part in the second trench through a via hole passing through the membrane and the supporting unit, and a through-silicon via (TSV) substrate provided on a lower surface of the device substrate, the TSV substrate including a plurality of first via metals connected to the plurality of first parts and a second via metal connected to the second part.

The first trench may be grid-shaped.

The device substrate may include a low resistance silicon substrate.

The device substrate may have a thickness from about 10 μm to about 50 μm.

The first trench and the second trench may have a same first width.

The first width may be from about 1 μm to about 10 μm.

The first trench and the second trench may be filled with an insulating material.

The capacitive micromachined ultrasonic transducer may further include a plurality of first bonding metals provided between the plurality of first parts and the plurality of first via metals and a second bonding metal provided between the second part and the second via metal.

The capacitive micromachined ultrasonic transducer may further include an insulating layer provided between the device substrate and the supporting unit and through which the via hole penetrates so that the second part contacts the upper electrode.

The capacitive micromachined ultrasonic transducer may further include an insulating layer provided between the membrane and the supporting unit and through which the via hole penetrates so that the second part contacts the upper electrode.

According to another aspect of an exemplary embodiment, there is provided a method of manufacturing a capacitive micromachined ultrasonic transducer, the method including forming a supporting unit on an upper surface of a device substrate or on a first silicon layer of a silicon on insulator (SOI) substrate, the supporting unit including an insulating layer for confining a plurality of cavities, bonding the SOI substrate on the upper surface of the device substrate to form the plurality of cavities between the SOI substrate and the device substrate, forming a first trench for insulating a plurality of first parts corresponding to a plurality of elements and a second trench confining a second part separated from the plurality of first parts, into a lower surface of the device substrate opposite the upper surface of the device substrate, bonding a through-silicon via (TSV) substrate on the lower surface of the device substrate, the TSV substrate including a plurality of first via metals configured to connect to the plurality of first parts and a second via metal configured to connect to the second part in the device substrate, removing a buried oxide layer of the SOI substrate and a second silicon layer on the buried oxide layer to leave the first silicon layer on the supporting unit, forming a via hole through the first silicon layer and the supporting unit to expose the second part, and forming an upper electrode on the first silicon layer such that the upper electrode contacts the second part through the via hole.

The bonding of the SOI substrate on the upper surface of the device substrate may include bonding the device substrate and the SOI substrate using a silicon direct bonding (SDB) method.

The forming of the first trench and the second trench may include thinning the device substrate to a thickness from about 10 μm to about 50 μm.

The forming of the first trench and the second trench may include forming the first trench and the second trench to have a same first width.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
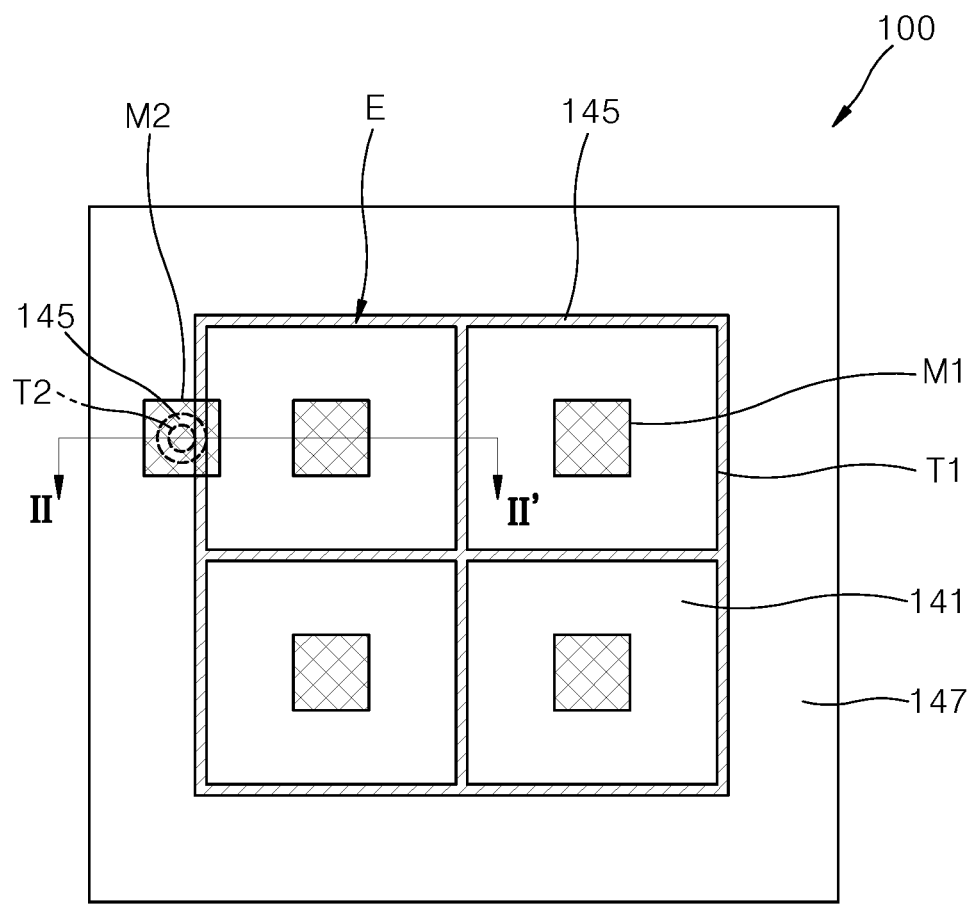
FIG. 1 is a bottom view of a structure of a capacitive micromachined ultrasonic transducer according to exemplary embodiments.

Exemplary embodiments now will be described more fully hereinafter with reference to the accompanying drawings, in which elements of the exemplary embodiments are shown. The exemplary embodiments may, however, be embodied in many different forms and should not be construed as being limited to the exemplary embodiments set forth herein. Rather, these exemplary embodiments are provided so that this disclosure will be thorough and complete, and will fully convey the scope of the exemplary embodiments to one of ordinary skill in the art. In the drawings, the thickness of layers and regions are exaggerated for clarity. It will also be understood that when a layer is referred to as being "on" another layer or substrate, the layer can be directly on the other layer or substrate, or intervening layers may also be present. The same reference numerals in different drawings represent the same element, and thus their description will be omitted.

Figure 2:
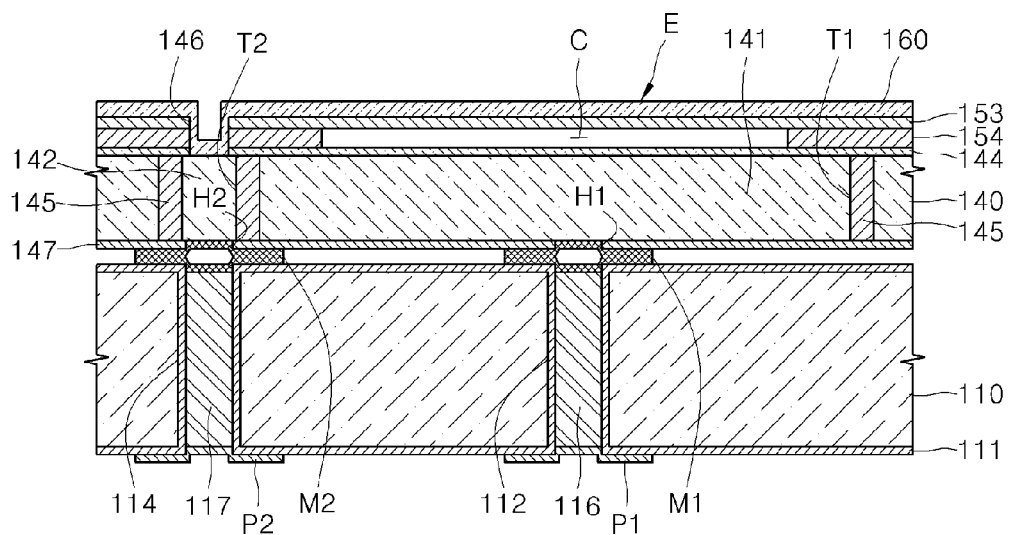
FIG. 2 is a cross-sectional view taken along line II-II' of FIG. 1.

FIG. 1 is a bottom view of a structure of a capacitive micromachined ultrasonic transducer 100 according to exemplary embodiments. FIG. 2 is a cross-sectional view taken along line II-II' of FIG. 1.

FIG. 1 is a bottom view of a device substrate 140. Referring to FIG. 1, the capacitive micromachined ultrasonic transducer 100 includes a plurality of elements E. For example, the capacitive micromachined ultrasonic transducer 100 may include the elements E arranged in a 16×16 matrix. In FIG. 1, for the sake of convenience, four elements E are illustrated. The capacitive micromachined ultrasonic transducer 100 may also be referred to as a capacitive micromachined ultrasonic transducer chip.

A first trench T1 as an insulating trench is formed around the elements E to prevent crosstalk among the elements E. The first trench T1 may be grid-shaped. First bonding metals M1 are formed in the elements E, respectively.

A second trench T2 is formed on one side of the elements E. A second bonding metal M2 is formed to be connected to a second part (142 of FIG. 2) surrounded by the second trench T2. The second trench T2 may be formed to be connected to the first trench T1, as illustrated in FIG. 1.

Referring to FIG. 2, the capacitive micromachined ultrasonic transducer 100 may include a through-silicon via (TSV) substrate 110 and the device substrate 140 bonded on the TSV substrate 110. The TSV substrate 110 and the device substrate 140 may be combined with each other by eutectic bonding.

The TSV substrate 110 is formed of a silicon substrate and includes a plurality of through holes 112. In the capacitive micromachined ultrasonic transducer 100, a through hole 114 for a top electrode and the through holes 112 corresponding to the respective elements E are formed. An insulating layer 111 is formed on surfaces of the through holes 112 and 114 and the TSV substrate 110. The through holes 112 are filled with a first via metal 116. The through hole 114 is filled with a second via metal 117.

In the device substrate 140, the second trench T2 and the grid-shaped first trench T1 that confines the plurality of elements E are formed. The device substrate 140 includes a first part 141 surrounded by the first trench T1 and the second part 142 surrounded by the second trench T2.

The device substrate 140 may be formed of a conductive material having a thickness of several tens of μm. A thickness of the device substrate 140 may be from about 10 μm to about 50 μm. The device substrate 140 may be formed of low resistance silicon doped with high density impurities.

The first part 141 and the second part 142 of the device substrate 140 are conductive regions. The first part 141 of the device substrate 140 may be used as a lower electrode.

The first trench T1 and the second trench T2 may be filled with an insulating material 145. The insulating material 145 may be formed of silicon oxide.

The device substrate 140 may include an insulating layer 144 on an upper surface of the device substrate 140, and a supporting unit 154 forming a cavity C and a membrane 153 that covers the cavity C in the supporting unit 154. An upper electrode 160 may be formed on the membrane 153. The membrane 153 may be formed of silicon. The supporting unit 154 may be formed of an insulator and may also be referred to as a first insulating layer. The supporting unit 154 may include, for example, oxide and nitride and may be formed of, for example, silicon oxide.

The upper electrode 160 may be formed of gold (Au), copper (Cu), tin (Sn), silver (Ag), aluminum (Al), platinum (Pt), titanium (Ti), nickel (Ni), chromium (Cr), or a mixture thereof.

The insulating layer 144 may include, for example, oxide and nitride and may be formed of, for example, silicon nitride.

In FIG. 2, it is illustrated that one cavity C is formed in one element E. However, the exemplary embodiments are not limited thereto, and, for example, a plurality of cavities C formed in a 5×5 array may be formed in one element E.

A via hole 146 that exposes the second part 142 of the device substrate 140 that is surrounded by the second trench T2 is formed through the membrane 153, the supporting unit 154, and the insulating layer 144. The upper electrode 160 is electrically connected to the second part 142 of the device substrate 140 through the via hole 146.

An insulating layer 147 is formed under the device substrate 140. A first hole H1 that exposes the first part 141 of the device substrate 140 and a second hole H2 that exposes the second part 142 of the device substrate 140 are formed in the insulating layer 147. The first hole H1 is formed at a position corresponding to a position of the first via metal 116, and the second hole H2 is formed at a position corresponding to a position of the second via metal 117.

The first bonding metal M1 is formed in the first hole H1 to connect the TSV substrate 110 to the first part 141, and the second bonding metal M2 is formed in the second hole H2 to connect the TSV substrate 110 to the second part 142. The first bonding metal M1 is formed to be connected to the first via metal 116 in the through hole 112, and the second bonding metal M2 is formed to be connected to the second via metal 117 in the through hole 114. The first bonding metal M1 and the second bonding metal M2 are formed by eutectic bonding metals formed in corresponding parts between the device substrate 140 and the TSV substrate 110 that are eutectic bonded.

A first electrode pad P1 and a second electrode pad P2 are formed under the TSV substrate 110 and are connected to the first via metal 116 and the second via metal 117, respectively. A ground voltage may be applied to the second electrode pad P2, and a driving signal voltage may be applied to the first electrode pad P1.

The driving signal voltage applied to the first electrode pad P1 is supplied to the first part 141 as the lower electrode through the first via metal 116 and the first bonding metal M1.

The ground voltage applied to the second electrode pad P2 is supplied to the upper electrode 160 through the second via metal 117, the second bonding metal M2, and the second part 142.

Hereinafter, a method of manufacturing a capacitive micromachined ultrasonic transducer according to exemplary embodiments will be described.

FIGS. 3A to 3I are cross-sectional views of a method of manufacturing a capacitive micromachined ultrasonic transducer according to exemplary embodiments. FIGS. 3A to 3I are cross-sectional views taken along line 11-11' of FIG. 1.

Figure 3A:
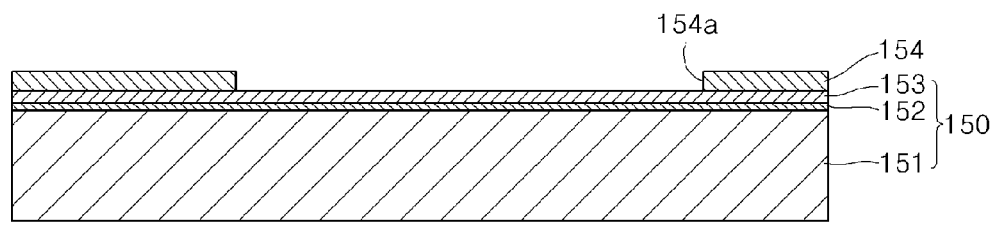
FIGS. 3A to 3I are cross-sectional views of a method of manufacturing a capacitive micromachined ultrasonic transducer according to exemplary embodiments.

Referring to FIG. 3A, after forming a first insulating layer 154 on a first wafer 150, the first insulating layer 154 is patterned to form an opening 154a. The first wafer 150 may be a silicon on insulator (SOI) wafer. The first wafer 150 may include a first silicon layer 151, a buried oxide layer 152, and a second silicon layer 153 that are sequentially stacked. The second silicon layer 153 corresponding to the membrane 153 of FIG. 2 may be formed to a thickness of about 2,000 Å.

The first insulating layer 154 may be formed of silicon oxide by oxidizing the first wafer 150. The patterned first insulating layer 154 corresponds to the supporting unit 154 of FIG. 2. A depth of the opening 154a may be determined by a thickness of the first insulating layer 154. The thickness of the first insulating layer 154 may be about 4,000 Å.

Figure 3B:
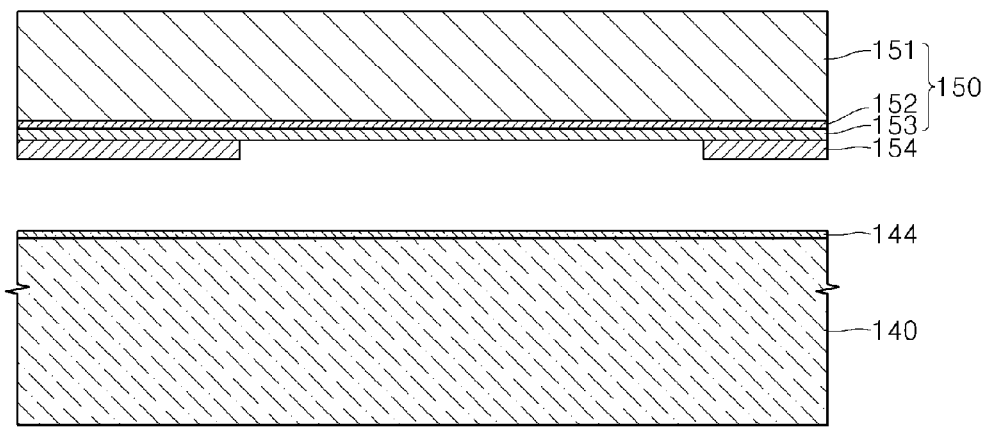

Referring to FIG. 3B, a second insulating layer 144 is formed on the device wafer 140. The first wafer 150 is bonded on the device wafer 140 so that the first insulating layer 154 and the second insulating layer 144 face each other. The device wafer 140 may be formed of low resistance silicon. The second insulating layer 144 may be formed of silicon oxide formed by thermally oxidizing the device wafer 140.

Figure 3C:
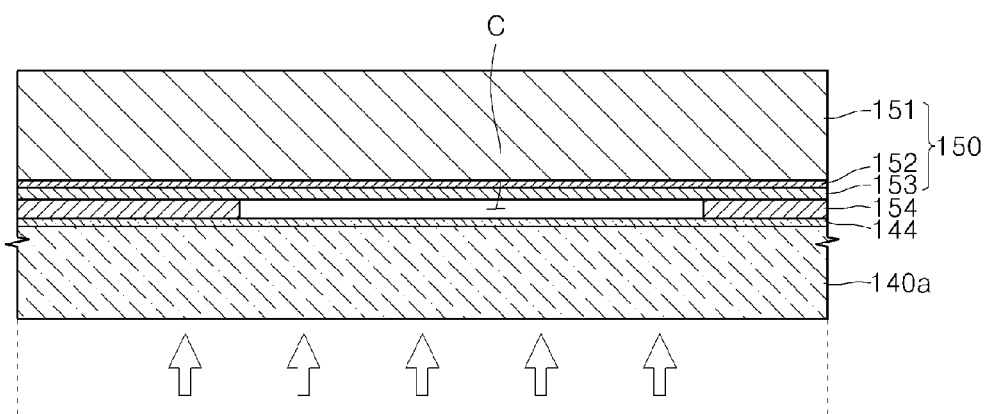

Referring to FIG. 3C, the first wafer 150 and the device wafer 140 may be wafer-to-wafer bonded by using a silicon direct bonding (SDB) process. The first wafer 150 and the device wafer 140 are bonded to form the cavity C as a sealed space.

The device wafer 140 is thinned to form a device wafer 140a having a thickness from about 10 μm to about 50 μm. To thin the device wafer 140, after mechanical lapping is performed on the device wafer 140, a chemical-mechanical polishing (CMP) process may be performed. By thinning the device wafer 140, a trench may be easily formed in the device wafer 140a.

Figure 3D:
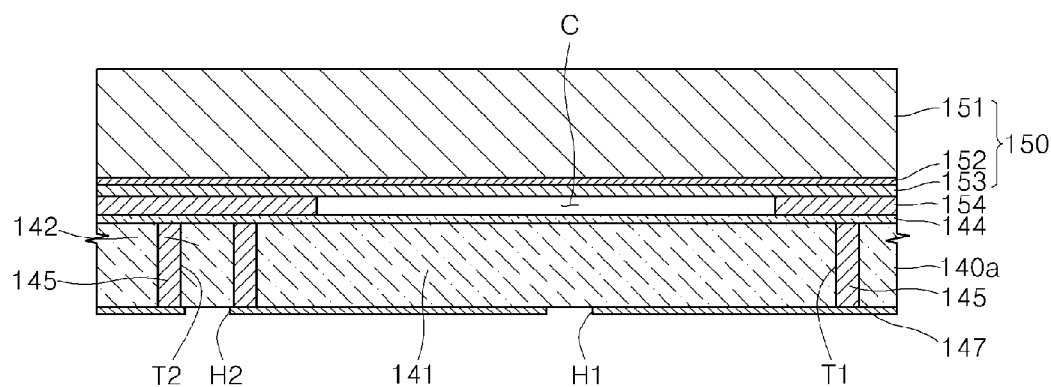

Referring to FIG. 3D, the first trench T1 and the second trench T2 are formed in the device wafer 140a. The first trench T1 is formed to surround the first part 141 of the device substrate 140a so as to separate the plurality of elements E of each chip. The first trench T1 may be grid-shaped as illustrated in FIG. 1. The second trench T2 is formed to surround the second part 142 of the device wafer 140a connected to the upper electrode (160 of FIG. 2).

The first trench T1 and the second trench T2 may be formed through the device wafer 140a. The first trench T1 and the second trench T2 may have the same width. Since the first trench T1 and the second trench T2 have the same width, the first trench T1 and the second trench T2 may be formed by using the same mask. In a conventional art, since a width of a trench separating elements E (corresponding to the second trench T2) is different from a width of an upper electrode-connecting via, an etching time of the trench separating the elements E is different from an etching time of the upper electrode-connecting via, and as a result, the trench and the upper electrode-connecting via are formed using separate etching processes. On the other hand, according to exemplary embodiments, the first trench T1 and the second trench T2 may be simultaneously formed.

The first trench T1 and the second trench T2 may have widths from about 1 μm to about 10 μm. If the widths of the first and second trenches T1 and T2 are smaller than 1 μm, an aspect ratio is large, and thus it may be difficult to perform etching. If the widths of the first and second trenches T1 and T2 are larger than 10 μm, a frequency characteristic of the capacitive micromachined ultrasonic transducer 100 may deteriorate.

Continuously, the device wafer 140a is thermally oxidized to fill the first trench T1 and the second trench T2 with silicon oxide 145. In addition, a third insulating layer 147 is formed on a lower surface of the device wafer 140a. The first trench T1 and the second trench T2 may not be completely filled with the silicon oxide 145.

The third insulating layer 147 is patterned to form the first hole H1 that exposes the first part 141 and the second hole H2 that exposes the second part 142 surrounded by the second trench T2. The first part 141 is a region corresponding to one element E.

Figure 3E:
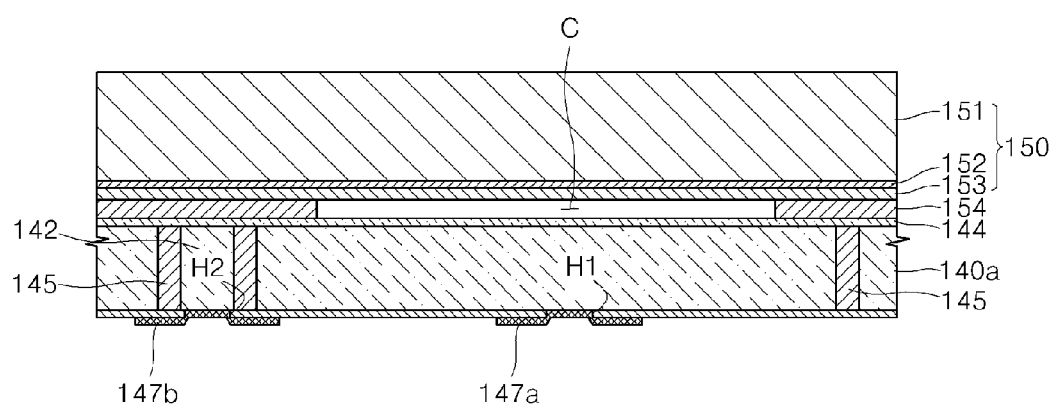

Referring to FIG. 3E, after depositing a metal layer on the third insulating layer 147, the metal layer is patterned to form a first bonding pad 147a and a second bonding pad 147b on the first hole H1 and the second hole H2, respectively. The first bonding pad 147a and the second bonding pad 147b may be formed of a material which may be used for eutectic bonding. For example, the first bonding pad 147a and the second bonding pad 147b may be formed of Au and/or Sn for Au—Sn eutectic bonding.

Figure 3F:
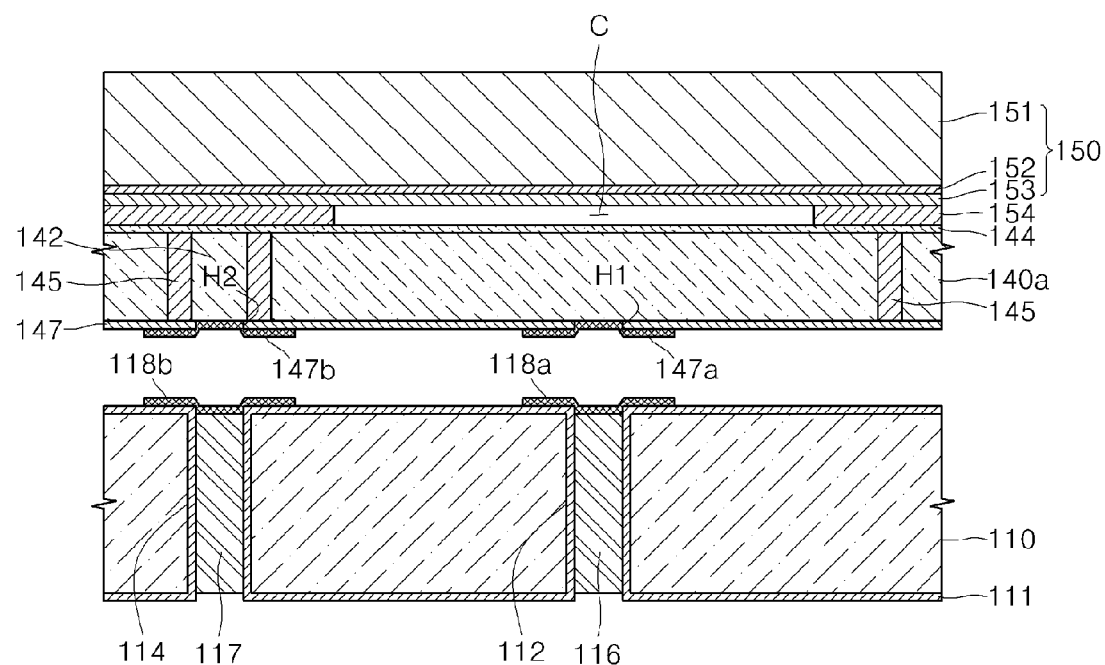

Referring to FIG. 3F, the TSV wafer 110 is provided. The first through hole 112 and the second through hole 114 are formed in the TSV wafer 110. The first through hole 112 and the second through hole 114 may be formed to widths of several tens of μm. The first through hole 112 is formed to correspond to the first part 141, and the second through hole 114 is formed to correspond to the second part 142.

The fourth insulating layer 111 is formed on the TSV wafer 110. The fourth insulating layer 111 may be formed by oxidizing the TSV wafer 110. The fourth insulating layer 111 may be formed on surfaces of the first and second through holes 112 and 114 and upper and lower surfaces of the TSV wafer 110. The first through hole 112 and the second through hole 114 are filled with a metal to form the first via metal 116 and the second via metal 117.

After forming a metal layer on the TSV wafer 110, the metal layer is patterned to form a third bonding pad 118a and a fourth bonding pad 118b. The third bonding pad 118a is formed on the first via metal 116 to correspond to the first bonding pad 147a, and the fourth bonding pad 118b is formed on the second via metal 117 to correspond to the second bonding pad 147b.

The third bonding pad 118a and the fourth bonding pad 118b may be formed of eutectic bonding metal. For example, the third bonding pad 118a and the fourth bonding pad 118b may be formed of Au and/or Sn for Au—Sn eutectic bonding.

Figure 3G:
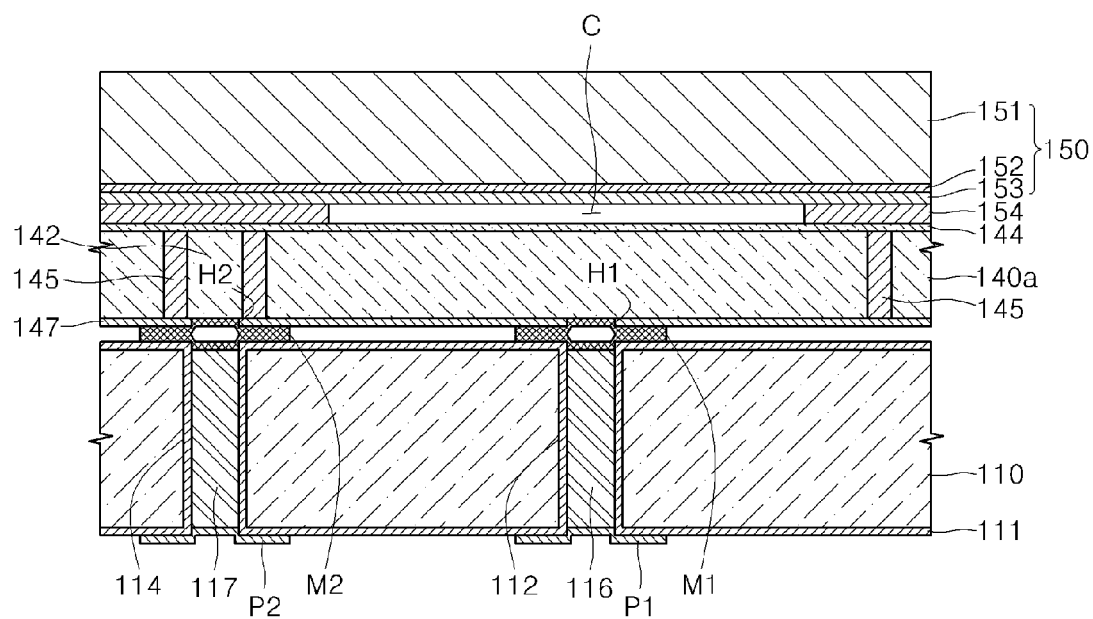

Referring to FIG. 3G, the TSV wafer 110 and the device wafer 140a are bonded at a wafer level. For example, the TSV wafer 110 and the device wafer 140a are eutectic bonded. The eutectic bonding may be performed by, for example, Au/Sn bonding. At this time, the first bonding pad 147a and the third bonding pad 118a are combined with each other to form the first bonding metal M1, and the second bonding pad 147b and the fourth bonding pad 118b are combined with each other to form the second bonding metal M2.

The first electrode pad P1 and the second electrode pad P2 are formed on the lower surface of the TSV wafer 110 and are connected to the first via metal 116 and the second via metal 117, respectively.

Figure 3H:
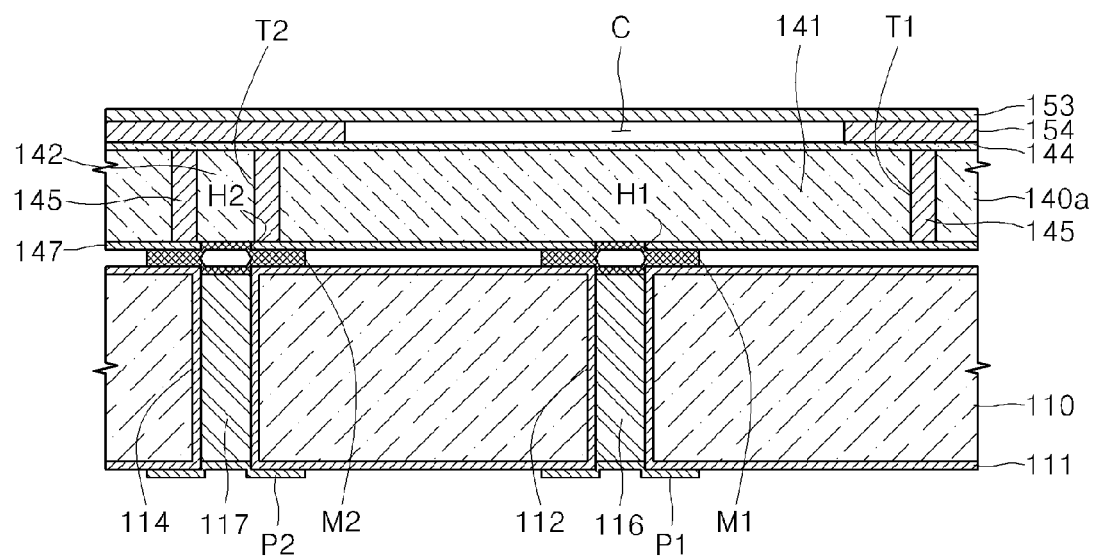

Referring to FIG. 3H, the first silicon layer 151 and the buried oxide layer 152 of the first wafer 150 are sequentially removed. The first silicon layer 151 may be thinned by performing mechanical lapping such that the first silicon layer 151 has a thickness of several tens of μm, and may be removed by dry etching. The buried oxide layer 152 may be removed by wet etching.

Figure 3I:
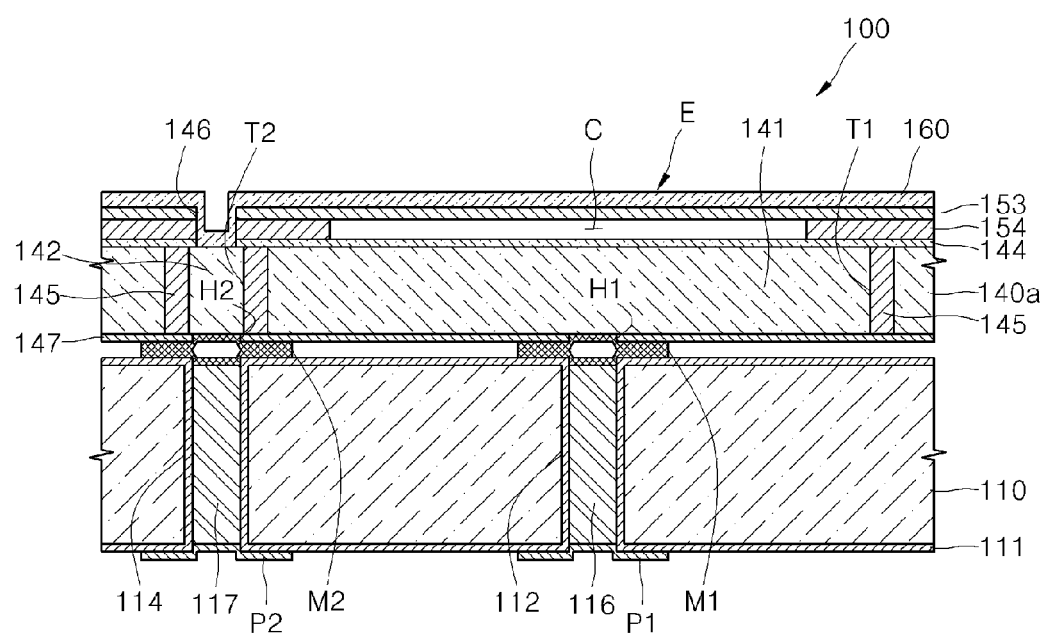

Referring to FIG. 3I, the via hole 146 is formed in the second silicon layer 153, the first insulating layer 154, and the second insulating layer 144 to expose the second part 142. The upper electrode 160 is formed on the second silicon layer 153. The upper electrode 160 is electrically connected to the second part 142.

A structure manufactured by the above-described processes is diced in units of chips to create a plurality of capacitive micromachined ultrasonic transducer chips 100.

In the method of manufacturing a capacitive micromachined ultrasonic transducer according to exemplary embodiments, since a trench for the upper electrode is formed when another trench for insulating an element is formed in the device wafer, processes are simplified. In addition, exemplary embodiments make it possible to prevent a via metal and a lower electrode of the element from being shorted during a back via process performed in a device substrate.

A capacitive micromachined ultrasonic transducer according to exemplary embodiments has a simple structure, since a low resistance device substrate is used as an electrical path for an upper electrode.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. A capacitive micromachined ultrasonic transducer comprising:
   a device substrate comprising (i) a first trench confining a plurality of first parts corresponding to a plurality of elements, and (ii) a second trench confining a second part separated from the plurality of first parts;
   a supporting unit provided on the device substrate for confining a plurality of cavities corresponding to each of the plurality of elements;
   a membrane provided on the supporting unit to cover the plurality of cavities;
   an upper electrode provided on the membrane and electrically connected to the second part in the second trench of the device substrate through a via hole passing through the membrane and the supporting unit; and
   a through-silicon via (TSV) substrate provided on a lower surface of the device substrate, the TSV substrate comprising a plurality of first via metals connected to the plurality of first parts in the device substrate and a second via metal connected to the second part in the device substrate.

2. The capacitive micromachined ultrasonic transducer of claim 1, wherein the first trench is grid-shaped.

3. The capacitive micromachined ultrasonic transducer of claim 1, wherein the device substrate comprises a conductive silicon substrate.

4. The capacitive micromachined ultrasonic transducer of claim 3, wherein the device substrate has a thickness from 10 μm to 50 μm.

5. The capacitive micromachined ultrasonic transducer of claim 4, wherein the first trench and the second trench have a same first width.

6. The capacitive micromachined ultrasonic transducer of claim 5, wherein the first width is from 1 μm to 10 μm.

7. The capacitive micromachined ultrasonic transducer of claim 1, wherein the first trench and the second trench are filled with an insulating material.

8. The capacitive micromachined ultrasonic transducer of claim 1, further comprising:
   a plurality of first bonding metals provided between the plurality of first parts and the plurality of first via metals; and
   a second bonding metal provided between the second part and the second via metal.

9. The capacitive micromachined ultrasonic transducer of claim 1, further comprising an insulating layer provided between the device substrate and the supporting unit and through which the via hole penetrates so that the second part contacts the upper electrode.

10. The capacitive micromachined ultrasonic transducer of claim 1, further comprising an insulating layer provided between the membrane and the supporting unit and through which the via hole penetrates so that the second part contacts the upper electrode.

* * * * *